(12) United States Patent
Choo et al.

(10) Patent No.: US 10,727,200 B2
(45) Date of Patent: Jul. 28, 2020

(54) MEMORY DEVICE INCLUDING BUMP ARRAYS SPACED APART FROM EACH OTHER AND ELECTRONIC DEVICE INCLUDING THE SAME

(71) Applicant: Samsung Electronics Co., Ltd., Suwon-si (KR)

(72) Inventors: Chul-Hwan Choo, Hwaseong-si (KR); Woong-Jae Song, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 37 days.

(21) Appl. No.: 16/115,741

(22) Filed: Aug. 29, 2018

(65) Prior Publication Data

US 2019/0259732 A1    Aug. 22, 2019

(30) Foreign Application Priority Data

Feb. 21, 2018    (KR) .......................... 10-2018-0020498

(51) Int. Cl.
*G06F 13/36*    (2006.01)
*H01L 25/065*    (2006.01)
(Continued)

(52) U.S. Cl.
CPC .......... *H01L 25/0652* (2013.01); *G06F 3/061* (2013.01); *G06F 3/0659* (2013.01);
(Continued)

(58) Field of Classification Search
CPC ... H01L 25/0652; G06F 3/061; G06F 3/0659; G06F 3/0673; G11C 5/04; G11C 5/06; G11C 5/063
(Continued)

(56) References Cited

U.S. PATENT DOCUMENTS 6,912,716 B1   6/2005  Johanson et al.
7,380,085 B2   5/2008  Matter et al.
(Continued)

FOREIGN PATENT DOCUMENTS

KR    10-1690109 B1    12/2016

*Primary Examiner* — Xiaochun L Chen
(74) *Attorney, Agent, or Firm* — Muir Patent Law, PLLC

(57) ABSTRACT

A memory device includes a buffer die including a first bump array and a second bump array spaced apart from each other in a first direction parallel to a lower surface of the buffer die; a first memory die stacked on the buffer die through a plurality of first through silicon vias and including banks; and a second memory die stacked on the first memory die by a plurality of second through silicon vias and including banks, wherein the first bump array is provided for a first channel to communicate between the first and second memory dies and a first processor, wherein the second bump array is provided for a second channel to communicate between the first and second memory dies and a second processor, and wherein the first channel and the second channel are independent of each other such that banks allocated to the first channel are accessed only by the first processor not the second processor through the first channel and banks allocated to the second channel are accessed only by the second processor not the first processor through the second channel.

17 Claims, 11 Drawing Sheets

(51) Int. Cl.
  *H01L 25/18* (2006.01)
  *G11C 8/18* (2006.01)
  *G11C 5/06* (2006.01)
  *G06F 3/06* (2006.01)
  *G11C 5/04* (2006.01)

(52) U.S. Cl.
  CPC .............. *G06F 3/0673* (2013.01); *G11C 5/04* (2013.01); *G11C 5/06* (2013.01); *G11C 5/063* (2013.01); *G11C 8/18* (2013.01); *H01L 25/18* (2013.01); *H01L 2225/06513* (2013.01); *H01L 2225/06517* (2013.01); *H01L 2225/06541* (2013.01)

(58) Field of Classification Search
  USPC .......................................................... 365/63
  See application file for complete search history.

(56) References Cited

U.S. PATENT DOCUMENTS

| | | | |
|---|---|---|---|
| 7,984,248 B2 | 7/2011 | Kottapalli et al. | |
| 9,274,839 B2 | 3/2016 | Schluessler | |
| 9,530,475 B2 | 12/2016 | Manning | |
| 2003/0093628 A1* | 5/2003 | Matter | G06F 9/5016 711/153 |
| 2008/0304352 A1* | 12/2008 | Chen | G06F 13/1694 365/230.02 |
| 2013/0159587 A1* | 6/2013 | Nygren | G11C 5/063 710/306 |
| 2015/0324290 A1 | 11/2015 | Leidel et al. | |
| 2016/0379115 A1 | 12/2016 | Burger et al. | |
| 2017/0220499 A1 | 8/2017 | Gray | |

* cited by examiner

MEMORY DEVICE INCLUDING BUMP ARRAYS SPACED APART FROM EACH OTHER AND ELECTRONIC DEVICE INCLUDING THE SAME

CROSS-REFERENCE TO RELATED APPLICATIONS

This U.S. non-provisional patent application claims priority under 35 U.S.C. § 119 to Korean Patent Application No. 10-2018-0020498, filed on Feb. 21, 2018, in the Korean Intellectual Property Office, the entire contents of which are hereby incorporated by reference.

BACKGROUND

Embodiments of the inventive concept relate to a memory device and an electronic device, more particularly, to a memory device including bump arrays spaced apart from each other and an electronic device including the same.

To increase a degree of an integration of a memory device, a plurality of memory dies may be stacked. To manufacture a memory device having a 3-dimensional structure, through silicon vias may be used to stack the memory dies. The stacked 3-dimensional memory device using the through silicon vias may provide a higher capacity and a higher bandwidth than a conventional memory device.

A processor using the 3-dimensional memory device may be various. Depending on an application, the processor may use the 3-dimensional memory device through all channels or some of the channels that are supported by the 3-dimensional memory device. Further, a plurality of processors may use one 3-dimensional memory device through the channels. By internally dividing a 3-dimensional memory device, the 3-dimensional memory device capable of providing the channels to the plurality of processors may be useful.

SUMMARY

Embodiments of the inventive concept provide a memory device including bump arrays spaced apart from each other and an electronic device including the same.

According to an exemplary embodiment, a memory device may include a buffer die including a first bump array and a second bump array spaced apart from each other in a first direction parallel to a lower surface of the buffer die; a first memory die stacked on the buffer die through a plurality of first through silicon vias and including banks; and a second memory die stacked on the first memory die by a plurality of second through silicon vias and including banks, wherein the first bump array is provided for a first channel to communicate between the first and second memory dies and a first processor, wherein the second bump array is provided for a second channel to communicate between the first and second memory dies and a second processor, and wherein the first channel and the second channel are independent of each other such that banks allocated to the first channel are accessed only by the first processor not the second processor through the first channel and banks allocated to the second channel are accessed only by the second processor not the first processor through the second channel.

According to an exemplary embodiment, a memory device may include a buffer die including a first bump array and a second bump array spaced apart from each other in a first direction parallel to a lower surface of the buffer die; a first memory die stacked on the buffer die through a plurality of first through silicon vias and including banks; and a second memory die stacked on the first memory die by a plurality of second through silicon vias and including banks, wherein the first bump array is provided for a first channel to communicate between the first and second memory dies and a first processor, wherein the second bump array is provided for a second channel to communicate between the first and second memory dies and a second processor, and wherein the first channel and the second channel are independent of each other such that banks allocated to the first channel are accessed only by the first processor not the second processor through the first channel and banks allocated to the second channel are accessed only by the second processor not the first processor through the second channel.

According to an exemplary embodiment, an electronic device may include a memory device including a buffer die and a plurality of memory dies each sequentially stacked on the buffer die through a plurality of through silicon vias, the plurality of memory dies including first banks allocated to a first channel and second banks allocated to a second channel; a first processor configured to access the first banks through the first channel; and a second processor configured to access the second banks through the second channel, wherein the buffer die comprises: a first bump array disposed on a first side of the buffer die adjacent to the first processor and including bumps configured to transmit and receive signals of the first channel; and a second bump array disposed on a second side of the buffer die opposite to the first side in a first direction parallel to a lower surface of buffer die adjacent to the second processor and including bumps configured to transmit and receive signals of the second channel, wherein the first channel and the second channel are independent of each other.

According to the above, the memory device may provide channels to at least two processes, respectively, using the bump arrays spaced apart from each other. According to embodiments of the inventive concept, since the bump arrays are spaced apart from each other, a routing of intra-channel transmission paths between the memory device and the processor may be improved.

DETAILED DESCRIPTION

Below, embodiments of the inventive concept will be described clearly and in detail with reference to accompanying drawings to such an extent that an ordinary one in the art implements embodiments of the invention.

Figure 1:
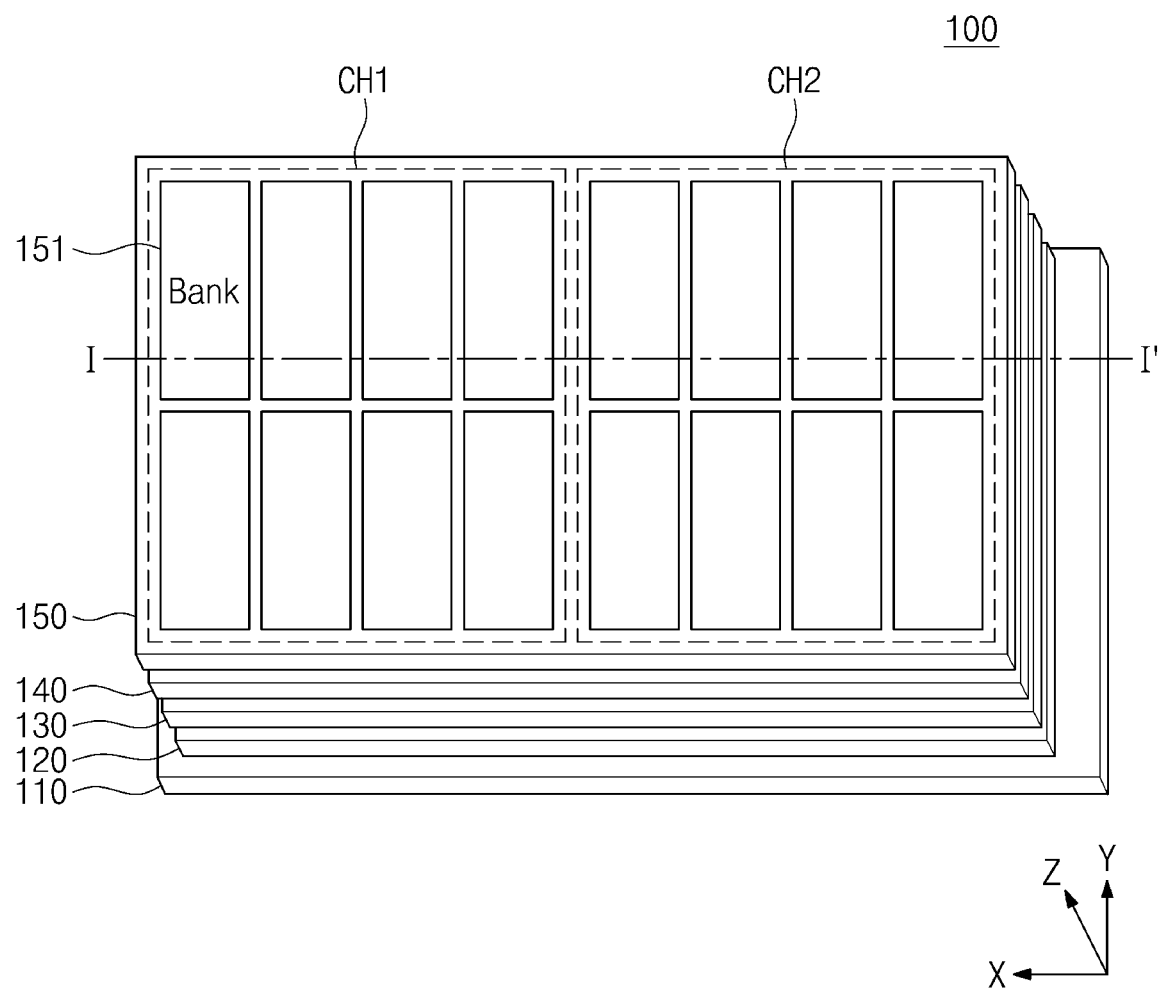
FIG. 1 is a block diagram illustrating an electronic device according to an exemplary embodiment of the inventive concept.

FIG. 1 is a view illustrating a memory device according to an exemplary embodiment of the inventive concept. The memory device 100 may include a buffer die 110 and first to fourth memory dies 120 to 150.

The buffer die 110 may include circuit components configured to buffer signals transmitted between an external device external to the memory device 100 (e.g., devices accessing the memory device 100 such as a host, a processor, a memory controller, etc.) and the first to fourth memory dies 120 to 150. For example, the buffer die 110 may include a buffer circuit (not shown), thereby compensating signal integrity of signals received from the external device and signals received from the first to fourth memory dies 120 to 150. For example, the buffer die 110 may transmit a command, an address, and a write data transmitted from the external device to at least one of the first to fourth memory dies 120 to 150. The buffer die 110 may transmit a read data transmitted from the first to fourth memory dies 120 to 150 to the external device. The buffer die 110 may be disposed at a bottom of the memory device 100 with respect to a Z-axis. The buffer die 110 may include circuit components configured to perform logic functions. In addition, the buffer die 110 may provide support for the first to fourth memory dies 120 to 150. Thus, the buffer die 110 may be referred to as a logic die or a base die/base layer.

The first to fourth memory dies 120 to 150 may be sequentially stacked on an upper surface of the buffer die 110 in the Z-axis direction (a direction perpendicular to the upper surface of the buffer die 110). Four memory dies 120 to 150 stacked on the upper surface of the buffer die 110 are shown in FIG. 1, but the number of the memory dies stacked on the upper surface of the buffer die 110 is not limited thereto.

The first to fourth memory dies 120 to 150 may be manufactured to have the same structure as each other. The fourth memory dies 150 may include banks 151. A bank may be referred to as a memory cell array including memory cells disposed at intersections of word lines (not shown) and bit lines (not shown). For example, the memory cells may include a dynamic random access memory (DRAM) cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, a magnetic random access memory (MRAM) cell, etc.

The number of the banks 151 may be determined by Joint Electron Device Engineering Council (JEDEC) standard and a capacity that is supported by the memory device 100. As the number of the banks 151 increases, although the number of row decoders (not shown) or column decoders (not shown) disposed adjacent to the banks 151 may increase, an accessibility to the memory device 100 may be improved. For the accessibility, at least two of the banks 151 may be included in one bank group, but the disclosure is not limited thereto. The fourth memory die 150 may further provide access paths to each of bank groups as well as access paths to each of banks. Since the memory device 100 may support the bank groups, the accessibility to the memory device 100 may be improved. The fourth memory die 150 is shown in FIG. 1 as including sixteen banks 151, but the scope of the inventive concept is not limited thereto.

In an exemplary embodiment, at least one of the banks 151 of the fourth memory die 150 may be allocated to a channel. The channel may provide access to a set (e.g., a bank group) including at least two or more banks, and channels may be independent of each other. Since the channels are independent of each other, banks allocated to any one channel are not accessed through other channels. A total capacity of the banks allocated to one channel may be determined based on a total capacity of the memory device 100 and the number of channels that are supported by the memory device 100. For example, the total capacity of the banks allocated to one channel may range from about 1 Gb to about 32 Gb, but the scope of the inventive concept is not limited thereto.

Referring to FIG. 1, the fourth memory die 150 may include sixteen banks 151, eight banks may be allocated to a first channel, and remaining eight banks may be allocated to a second channel. As described above, the first to third memory dies 120 to 140 may be manufactured to have the same structure as the fourth memory die 150. Therefore, the memory device 100 may support eight channels, each of the first to fourth memory dies 120 to 150 may support two channels, and eight banks may be allocated to one channel. However, the above mentioned numerical values are all exemplary.

Unlike shown in FIG. 1, the banks 151 of the memory die 150 may be all allocated to one channel or may be allocated to four or more channels. Also, the number of the banks allocated to one channel is eight in FIG. 1, but the scope of the inventive concept is not limited thereto. For example, sixteen or more banks may be allocated to one channel. The banks of the memory device 100 may be divided into channels that are supported by the memory device 100. The number of the channels supported by the memory device 100 may be determined based on the number of the first to fourth memory dies 120 to 150, the number of the banks 151, and the number of banks per one channel.

Unlike a conventional DRAM device such as a double date rate (DDR) 4 and a DDR 5, the memory device 100 may be a 3-dimensional stacked memory device such as a high bandwidth memory (HBM), an HBM2, an HBM3, etc., which provide a high capacity and a high bandwidth. According to exemplary embodiments, the memory device 100 may be a memory device having a relatively high operation bandwidth and may operate using a plurality of access channels as illustrated in the exemplary embodiments compared to a low-bandwidth memory device which has a relatively low operation bandwidth and which may operate using only one channel. For example, the memory device 100 may comprise a Wide I/O memory device, compared to a low-bandwidth memory device such as a Low-Power DDR (LPDDR) memory device. In particular, the memory device 100, unlike the conventional DRAM, may include hundreds, thousands, or more data input/output pins for the high bandwidth. For example, the memory device 100 may support 2n prefetch, 4n prefetch, 8n prefetch, 16n prefetch, etc. Additionally, the memory device 100 may support BL (burst length) 2, BL4, BL8, BL16, etc. The "n" is a natural number. A conventional HBM device may be used for one processor that requires both the high capacity and the high bandwidth.

The memory device 100 according an exemplary embodiment of the inventive concept may be divided and used by at least two processors operating independently of each other. These at least two processors may require a lower bandwidth or a lower capacity than a processor that requires all data input/output pins and all banks of the memory device 100 to operate. Hereinafter, the memory device 100 that may be used by at least two processors will be described.

Figure 2:
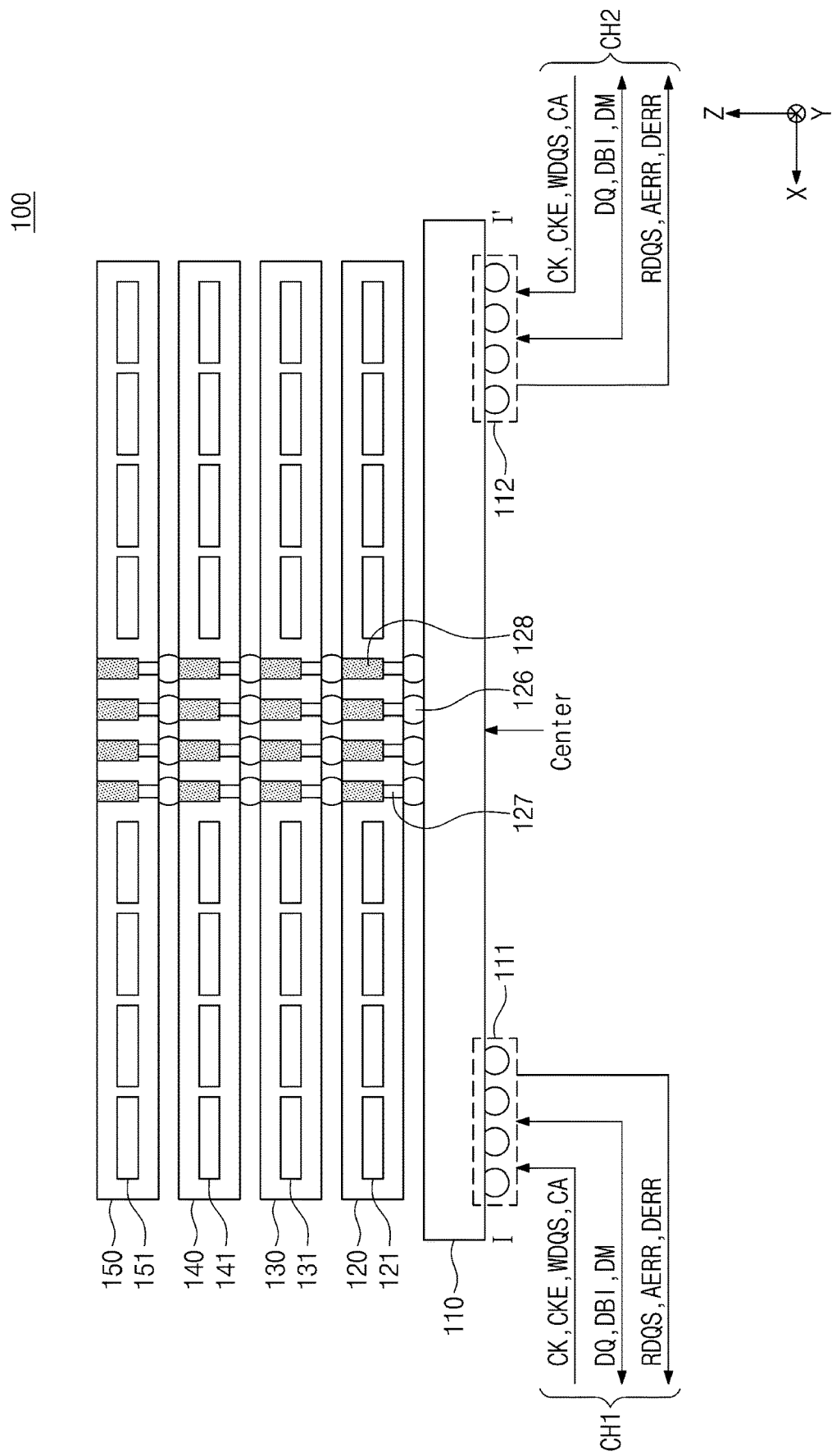
FIG. 2 is view for describing the command queue base interface operation according to an exemplary embodiment of the inventive concept.

FIG. 2 is a cross-sectional view take along a line I-I' illustrated in FIG. 1. The buffer die 110 may include a first bump array 111 for a first channel CH1 and a second bump array 112 for a second channel CH2. Each of the first bump array 111 and the second bump array may include a plurality of solder bumps for electrically connecting the memory device 100 to an external device external to the memory device 100. Each of the first channel CH1 and the second channel CH2 may be configured to be an independent command and a data interface. For example, signals transmitted or received via the first channel CH1 may not control operations of banks connected to the second channel CH2 and signals transmitted or received via the second channel CH2 may not control operations of banks connected to the first channel CH1. According to exemplary embodiments, signals included in the first channel CH1 may be transmitted from the external device to the memory device 100 or from the memory device 100 to the external device through the first bump array 111 and signals included in the second channel CH2 may be transmitted from the external device to the memory device 100 or from the memory device 100 to the external device through the second bump array 112.

The signals included in the first and second channels CH1, CH2 may include input signals, input/output signals, and output signals. For example, the input signals may include clock signals CK_t and CK_c, a clock enable signal CKE, write data strobe signals WDQS_t and WDQS_c, and command and address signals CA. Here, for brevity of FIG. 2, only CK representing clock signals CK_t and CK_c is illustrated in FIG. 2 and only WDQS representing write data strobe signals WDQS_t and WDQS_c is illustrated in FIG. 2.

The clock signals CK_t and CK_c may be transmitted in a differential manner from the external device. The clock enable signal CKE may be used to activate or inactivate a clock, input buffers, and output drivers within the memory device 100. For example, the clock enable signal CKE may be provided as a low (logic "0") in a precharge power-down operation, an active power-down operation, and a self-refresh operation. The write data strobe signals WDQS_t and WDQS_c may be transmitted in a differential manner from the external device. The write data strobe signals WDQS_t and WDQS_c may be used to sample data input/output signals including a write data.

The command and address signals CA may be synchronized to clock signals. For example, the memory device 100 may sample the command and address signals CA at raising edges or falling edges of the clock signals based on a DDR manner. The command and address signals CA may include row command and address signals and column command and address signals.

The row command and address signals may be synchronized to the clock signals and may be used to select at least one word line of the bank. The row command and address signals may include an activation command, a precharge command, a refresh command, a bank address, and a row address. The column command and address signals may be synchronized to the clock signals and may be used to select bit lines crossing the selected word line. The column command and address signals may include a write command, a read command, a bank address, and a column address. For example, the number of memory cells selected by the row command and address signals and the column command and address signals may be determined based on 2n prefetch, 4n prefetch, 8n prefetch, and 16n prefetch that are supported by the memory device 100. A prefetch scheme may be used to compensate a difference between a data input/output rate of a bank and a data input/output rate of the first and second channels CH1 and CH2. For example, in a 2n prefetch scheme, 2 bits are prefetched from one bank per one data input/output signal DQ. Similarly, in a 4n prefetch scheme, 4 bits are prefetched from one bank per one data input/output signal DQ, in an 8n prefetch scheme, 8 bits are prefetched from one bank per one data input/output signal DQ, and in a 16n prefetch scheme, 16 bits are prefetched from one bank per one data input/output signal DQ.

The row command and address signals or the column command and address signals may further include mode register setting commands to set an operation mode of the memory device 100. The memory device 100 may further include mode registers to store an operation code (OP code) for the mode register setting commands.

For example, the input/output signals may include data input/output signals DQ, data bus inversion signals DBI for a low power, and data mask signals DM to mask data that is not desired to be written. The data input/output signals DQ may include a write data stored to the memory cells selected by the row command and address signals and the column command and address signals or a read data output from the selected memory cells. For example, the number of the data input/output signals DQ per one channel may be a multiple of 2, such as 128, 256, etc. One data bus inversion signal and one data mask signal may be used per the data input/output signals DQ having a byte unit.

For example, the output signals may include read data strobe signals RDQS_t and RDQS_c, an address parity error signal AERR, and data parity error signals DERR. Here, for brevity of FIG. 2, RDQS representing read data strobe signals RDQS_t and RDQS_c is illustrated in FIG. 2. The read data strobe signals RDQS_t and RDQS_c may be used to sample the data input/output signals DQ including the read data. The address parity error signal AERR may indicate whether the parity error is occurred in the command and address signals CA. The data parity error signals DERR may indicate whether the parity error is occurred in the data input/output signals DQ.

In the exemplary embodiment, the first bump array 111 may be spaced apart from a center of a lower surface of the buffer die 110 in X-axis direction. Similarly, the second bump array 112 may be spaced apart from the center of the lower surface of the buffer die 110 in a direction opposite to the X-axis. The first bump array 111 and the second bump array 112 may not be disposed adjacent to each other and may be spaced apart from each other in the X-axis direction. For example, the first bump array 111 and the second bump array 112 may be disposed adjacent to different sides of the buffer die 110, respectively. For example, the first bump array 111 may be disposed at a first edge of the lower surface of the buffer die 110 and the second bump array 112 may be disposed spaced apart from the first bump array 111 at a second edge of the lower surface of the buffer die 110 opposite to the first edge in the X-axis direction.

Referring to FIG. 2, an external device (not shown) disposed on a left side of the memory device 100 with respect to the Z-axis may exchange signals of the first channel CH1 with the memory device 100 through the first bump array 111. An external device (not shown) disposed on a right side of the memory device 100 with respect to the Z-axis may exchange signals of the second channel CH2 with the memory device 100 through the second bump array 112. Thus, an external device (not shown) disposed on a left side of the memory device 100 with respect to the Z-axis may not exchange signals of the second channel CH2 with the memory device 100 through the second bump array 112 and an external device (not shown) disposed on a right side of the memory device 100 with respect to the Z-axis may not exchange signals of the first channel CH1 with the memory device 100 through the first bump array 111. For example, according to certain embodiments, signals transmitted/received through the first channel CH1 can only control operations between the first and second memory dies 120, 130, (or the third and fourth memory dies 140, 150 in another embodiment) and a first processor disposed on a left side of the memory device 100 with respect to the Z-axis and signals transmitted/received through the second channel CH2 can only control operations between the first and second memory dies 120, 130 (or the third and fourth memory dies 140, 150 in another embodiment) and a second processor disposed on a right side of the memory device 100 with respect to the Z-axis.

Since the first bump array 111 and the second bump array 112 may be spaced apart from each other, the memory device 100 may provide the first channel CH1 to one external device adjacent to the first bump array 111 and may provide the second channel CH2 to another external device adjacent to the second bump array 112. According to the exemplary embodiment of the inventive concept, since lengths of intra-channel transmission paths between the memory device 100 and the external device are shortened, a routing of the transmission paths may be improved.

In the exemplary embodiment, the buffer die 110 may further include a bump array (not shown) to transmit global signals. The global signals may be common signals for all channels that are supported by the memory device 100. For example, the global signals may include a reset signal, power supply signals, and a signal indicating a temperature of the memory device 100. For example, the bump array to transmit the global signals may be disposed adjacent to the center of the lower surface of the buffer die 110 between the first and second edges of the lower surface of the buffer die 110.

The first memory die 120 may include first banks 121. The first banks 121 may be substantially the same as the banks 151 shown in FIG. 1. Bumps 126 may be disposed between the first memory die 120 and the buffer die 110 to electrically connect the first memory 120 and the buffer die 110. According to exemplary embodiments, the bumps 126 may be disposed between middle portion (e.g., centrally disposed) of the upper surface of the buffer die 110 and middle portion of the lower surface of the first memory die 120 to electrically connect the first memory die 120 and the buffer die 110 to each other. The first memory die 120 may include metal lines 127 and through silicon vias 128. The metal lines 127 may electrically connect the bumps 126 and the through silicon vias 128. Shapes of the metal lines 127 are not limited to those shown in FIG. 2. The through silicon vias 128 may be formed by passing through a substrate in the Z-axis direction to electrically connect the buffer die 110 and the second to fourth memory dies 130 to 150. The first to fourth memory dies 120 to 150 may be stacked on buffer die 110 through the through silicon vias 128. In the present specification, it is understood that when an element is referred to as being "electrically connected" to another element, it may be connected directly to the other element or intervening elements may be present. As used herein, and unless indicated otherwise, items described as being "electrically connected" are configured such that an electrical signal can be passed from one element to the other. The second to fourth memory dies 130 to 150 may be manufactured similarly to the first memory die 120.

For example, it is assumed that the memory device 100 supports eight channels. Some of the fourth banks 151 of the fourth memory die 150 may be allocated to the first channel and the remaining fourth banks 151 may be allocated to the second channel. Some of the third banks 141 of the third memory die 140 may be allocated to a third channel and the remaining third banks 141 may be allocated to a fourth channel. Some of the second banks 131 of the second memory die 130 may be allocated to a fifth channel and the remaining second banks 131 may be allocated to a sixth channel. Some of the first banks 121 of the first memory die 120 may be allocated to a seventh channel and the remaining first banks 121 may be allocated to an eighth channel. The number of the banks allocated to each of the first to eighth channels may be equal to or different from each other. The mapping relationship between the first to fourth banks 121, 131, 141, and 151 of the first to fourth memory dies 120 to 150 and the first to eighth channels is not limited to above exemplary description.

Banks allocated to any one channel may include at least one of the first banks 121, at least one of the second banks 131, at least one of the third banks 141, or at least one of the fourth banks 151. Banks allocated to any one channel may be all disposed in one memory die or may be distributed to some memory dies. Banks allocated to one channel and banks allocated to another channel may be different from each other.

Figure 3:
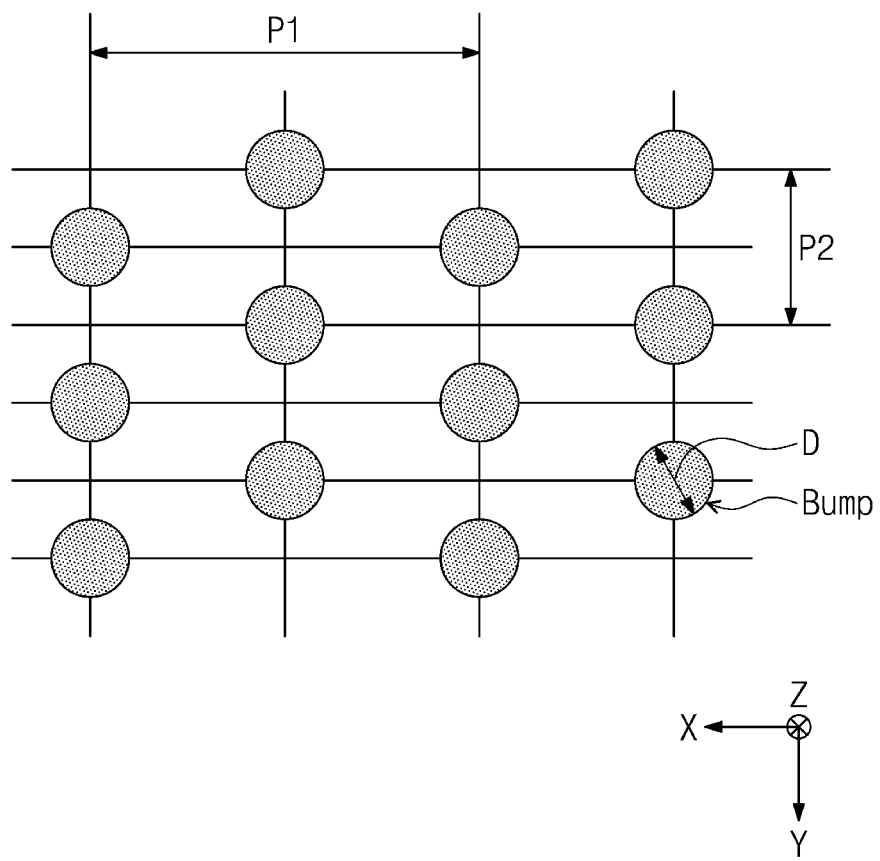
FIG. 3 is a block diagram illustrating an electronic device according to an exemplary embodiment of the inventive concept.

FIG. 3 is a view illustrating a portion of the first bump array 111 illustrated in FIG. 2. When viewing the lower surface of the buffer die 110 shown in FIG. 2 in the Z-axis direction, bumps of the first bump array 111 may be disposed in a manner as shown in FIG. 3. The number of the bumps shown in FIG. 3 is only exemplary. The bumps of the first bump array 111 may transmit or receive the signals of the first channel. For example, the bumps of the first bump array 111 may be disposed as a staggered pattern.

A pitch P1 may indicate a horizontal pitch of bumps adjacent to each other having the same Y coordinate value. A pitch P2 may indicate a vertical pitch of bumps adjacent to each other having the same X coordinate value. According to exemplary embodiments, the pitch P1 may have a value larger than the pitch P2. A diameter D may indicate a diameter of each of the bumps. For example, each of the pitch P1, the pitch P2, and the diameter D may have values from a few micrometers to tens micrometers. Therefore, the bump may be referred to as a micro bump and the bump array may be referred to as a micro bump array. According to exemplary embodiments, the diameter D of each of the bumps may be larger than the thickness of the metal lines 127 in a direction parallel to the X-axis.

Figure 4:
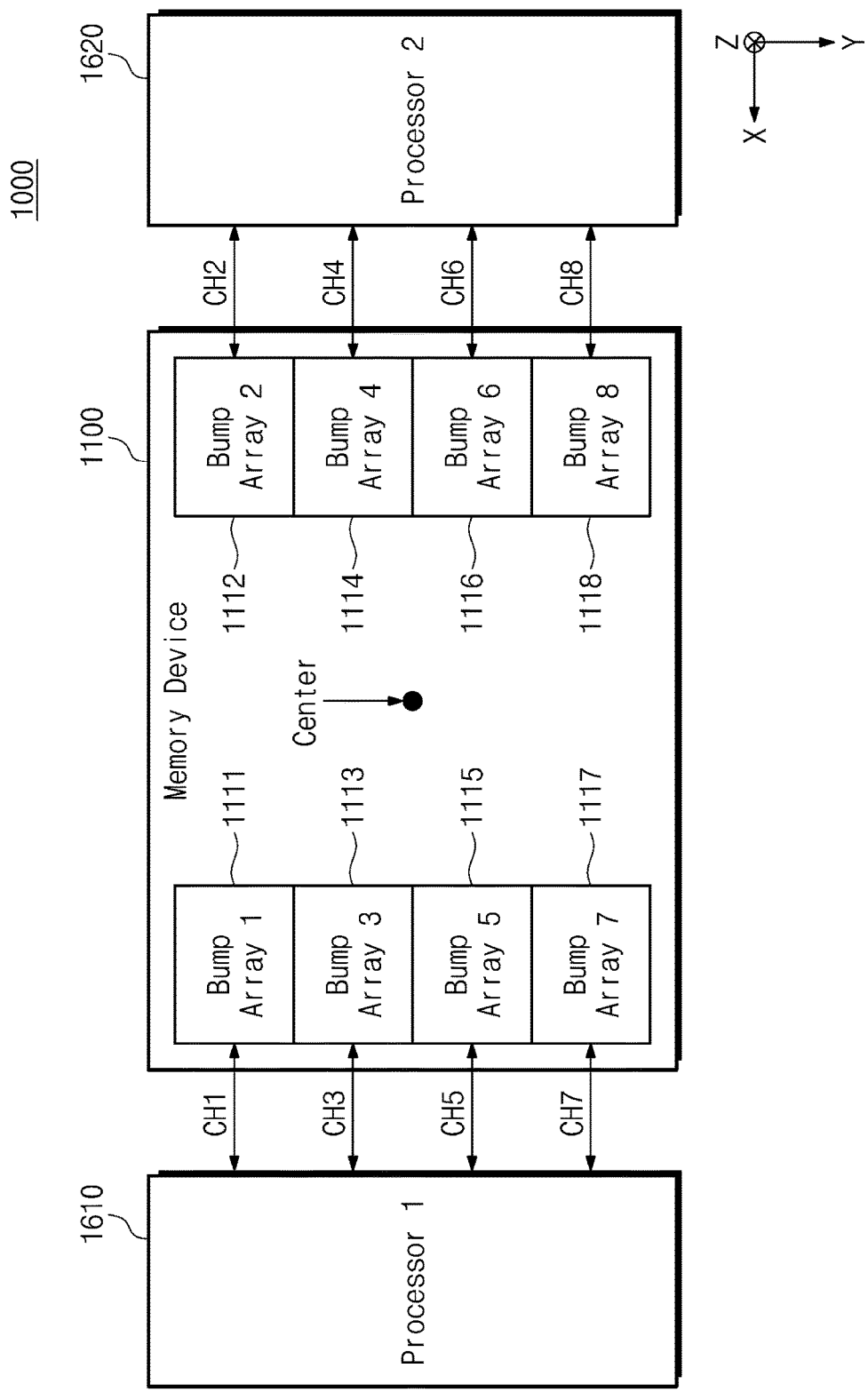
FIG. 4 is a block diagram illustrating an electronic device according to an exemplary embodiment of the inventive concept.

FIG. 4 is a block diagram illustrating an electronic device according to an exemplary embodiment of the inventive concept. The electronic device 1000 shown in FIG. 4 will be described with reference to FIGS. 1 and 2. The electronic device 1000 may include a memory device 1100, a first processor 1610, and a second processor 1620. Referring to FIG. 4, the memory device 1100 may indicate the lower surface of the buffer die 110 when viewing the memory device 100 of FIG. 1 in the Z-axis direction. The memory device 1100 may be the memory device 100 described in FIGS. 1 and 2. According to exemplary embodiments, the memory device 1100, the first processor 1610, and the second processor 1620 are mounted on a circuit board, e.g., a printed circuit board (PCB) (not shown). The first processor 1610 and the second processor 1620 may electrically communicate with the memory device 1100 through wiring in the circuit board that connect to corresponding bumps of each or the first processor 1610, the second processor 1620, and the memory device 1100.

For example, the memory device 1100 may support the first to eighth channels CH1 to CH8. The memory device 1100 may communicate with the first processor 1610 through the first channel CH1, third channel CH3, fifth channel CH5, and seventh channel CH7. Similarly, the memory device 1100 may communicate with the second processor 1620 through the second channel CH2, fourth channel CH4, sixth channel CH6, and eighth channel CH8. The memory device 1100 may provide four channels of the eight channels to the first processor 1610 and may provide remaining four channels to the second processor 1620. Banks of the memory device 1100 may be divided into banks of channels allocated to the first processor 1610 and banks of channels allocated to the second processor 1620.

First to eighth bump arrays 1111 to 1118 for the first to eighth channels CH1 to CH8 may be disposed on a lower surface of the memory device 1100 (i.e., the lower surface of the buffer die of the memory device 1100). The signals of the first channel CH1 may be transmitted through the first bump array 1111. The memory device 1100 may provide the first channel CH1 to the first processor 1610 using the first bump array 1111. Signals of other channels may also be transmitted similarly to those of the first channel CH1 and the memory device 1100 may provide other channels using other bump arrays. The number of the channels supported by the memory device 1100 and the number of the bump arrays for the channels are not limited to above exemplary description.

In the exemplary embodiment, the first, third, fifth, and seventh bump arrays 1111, 1113, 1115, and 1117 may be spaced apart from the center of the lower surface of the memory device 1100 in the X-axis direction, on a first side of the center of the lower surface of the memory device 1100. For example, the first, third, fifth, and seventh bump arrays 1111, 1113, 1115, and 1117 may be spaced apart from an axis, that passes the center of the lower surface of the memory device 1100 and is parallel to Y-axis, in the X-axis direction on a first side of the center of the lower surface of the memory device 1100. The first, third, fifth, and seventh bump arrays 1111, 1113, 1115, and 1117 may be disposed adjacent to a first side of the buffer die 110 adjacent to the first processor 1610. The second, fourth, sixth, and eighth bump arrays 1112, 1114, 1116, and 1118 may be spaced apart from the center of the lower surface of the memory device 1100 in a direction opposite to the X-axis direction, on a second side of the center of the lower surface of the memory device 1100 opposite to the first side (also described as a forward X-axis direction, as indicated by the arrow direction in FIG. 4). For example, the second, fourth, sixth, and eighth bump arrays 1112, 1114, 1116, and 1118 may be spaced apart from an axis, that passes the center of the lower surface of the memory device 1100 and is parallel to Y-axis, on a second side of the center of the lower surface of the memory device 1100 opposite to the first side (also described as an opposite X-axis direction, opposite to the arrow direction in FIG. 4). The second, fourth, sixth, and eighth bump arrays 1112, 1114, 1116, and 1118 may be disposed adjacent to a second side of the buffer die 110 adjacent to the second processor 1620. The first, third, fifth, and seventh bump arrays 1111, 1113, 1115, and 1117 and the second, fourth, sixth, and eighth bump arrays 1112, 1114, 1116, and 1118 may be spaced apart from each other in the X-axis direction.

In the exemplary embodiment, centers of first, third, fifth, and seventh bump arrays 1111, 1113, 1115, and 1117 may have the same X coordinate value. Positions on the Y-axis of first, third, fifth, and seventh bump arrays 1111, 1113, 1115, and 1117 may be differently disposed from those shown in FIG. 4. Centers of second, fourth, sixth, and eighth bump arrays 1112, 1114, 1116, and 1118 may have the same X coordinate value. Positions on the Y-axis of second, fourth, sixth, and eighth bump arrays 1112, 1114, 1116, and 1118 may be differently disposed from those shown in FIG. 4. The first processor 1610 may access internal banks of the memory device 1100 through at least one of the first, third, fifth, and seventh channels CH1, CH3, CH5, and CH7 which are independent of each other. For example, banks allocated to CH1 may only be accessed by the first processor 1610 through the first channel CH1 and may not be accessed by the first processor 1610 through the third, fifth, and seventh channels CH3, CH5, and CH7, and so on.

The banks, to which the first processor 1610 can access, may be the banks allocated to the first, third, fifth, and seventh channels of all banks of the memory device 100. For example, the first processor 1610 may be a central processing unit (CPU), a graphics processing unit (GPU), a neural processing unit (NPU), an application processor (AP), and the like. The first processor 1610 may be implemented as a field programmable gate array (FPGA), an application specific integrated circuit (ASIC), a system on chip (SoC), and the like.

The second processor 1620 may access internal banks of the memory device 1100 through at least one of the second, fourth, sixth, and eighth channels which are independent of each other. For example, banks allocated to CH2 may only be accessed by the second processor 1620 through the second channel CH2 and may not be accessed by the second processor 1620 through the fourth, sixth, and eighth channels CH4, CH6, and CH8, and so on. The second processor 1620 may be implemented and operated similarly to the first processor 1610. For example, the second processor 1620 may be the same as the first processor 1610 or may be different from the first processor 1610. For example, the memory device 1100 may provide at least one channel to each of at least two homogeneous processors or to each of at least two heterogeneous processors.

In the exemplary embodiment, the first processor 1610, one of the first, third, fifth, and seventh bump arrays 1111, 1113, 1115, and 1117, one of the second, fourth, sixth, and eighth bump arrays 1112, 1114, 1116, and 1118, and the second processor 1620 may be disposed sequentially along a first axis that passes the center of the lower surface of the memory device 1100 and is parallel to the X-axis. The first, third, fifth, and seventh bump arrays 1111, 1113, 1115, and 1117 and the second, fourth, sixth, and eighth bump arrays 1112, 1114, 1116, and 1118 may be symmetrical with respect to a second axis, respectively. The second axis may be perpendicular to the first axis, be parallel to a Y-axis, and pass the center of the lower surface of the memory device 1100.

In the exemplary embodiment, the first processor 1610 and the first, third, fifth, and seventh bump arrays 1111, 1113, 1115, and 1117 may be disposed adjacent to the first side of the buffer die. The second processor 1620 and the second, fourth, sixth, and eighth bump arrays 1112, 1114, 1116, and 1118 may be disposed adjacent to the second side of the buffer die. For example, the first side and the second side of the buffer die may be opposed to each other in the X-axis direction.

Figure 5:
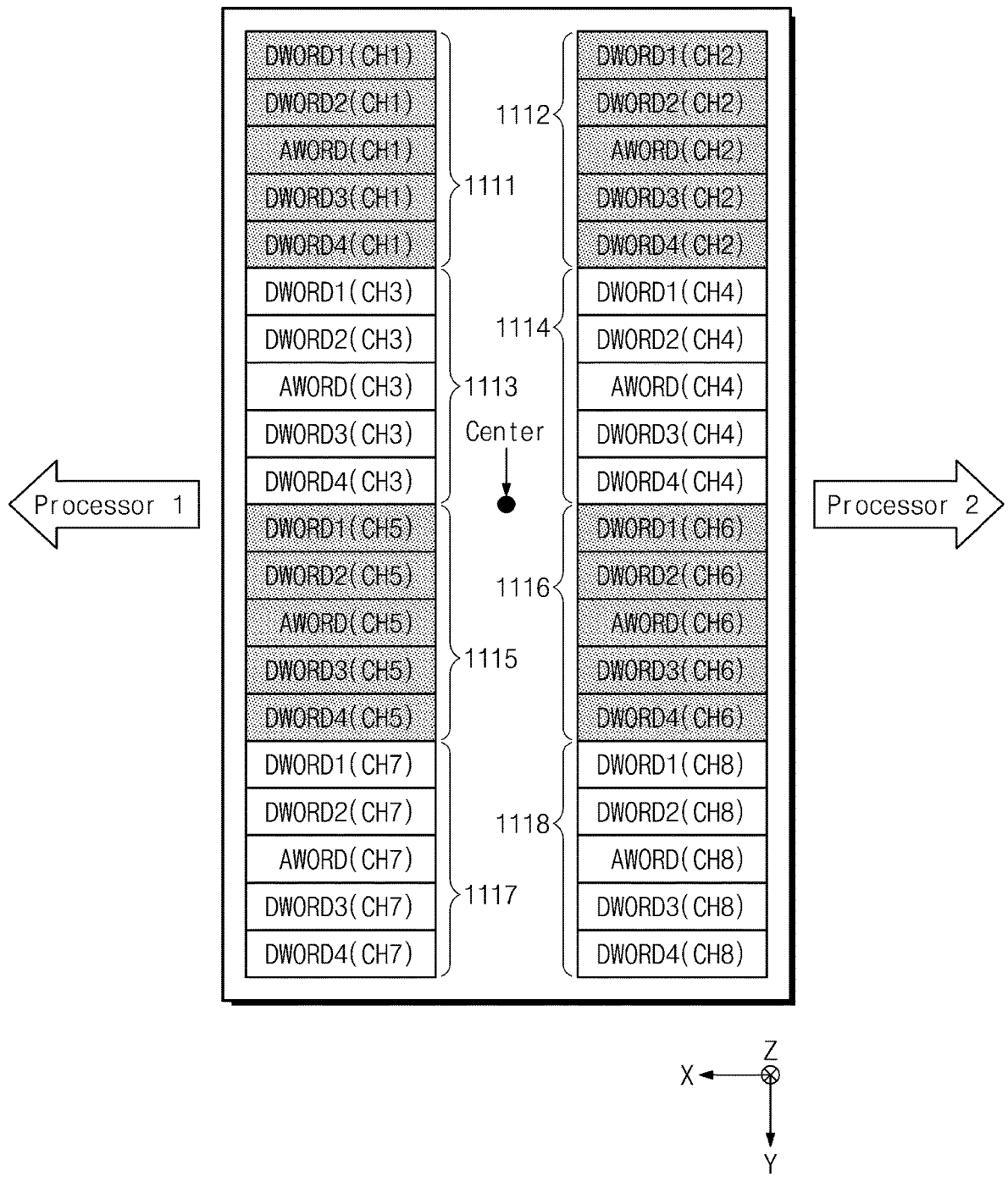
FIG. 5 is a conceptual diagram illustrating a management policy independently applied to each interface operation according to an exemplary embodiment of the inventive concept.
Figure 6:
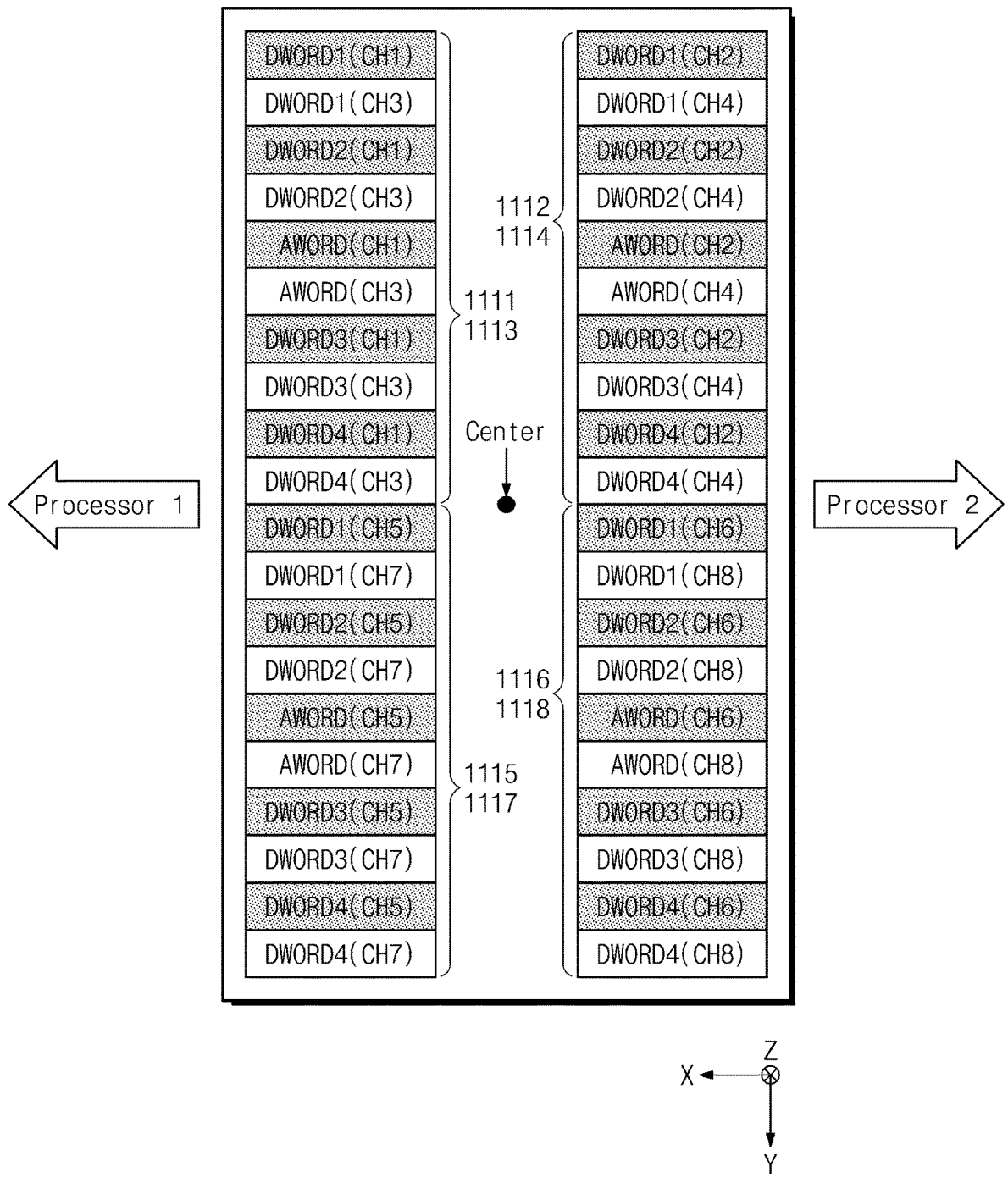
FIG. 6 is view for describing an operation of loading data of an electronic device according to an exemplary embodiment of the inventive concept.

FIGS. 5 and 6 are views illustrating the lower surface of the memory device illustrated in FIG. 4. The lower surface of the memory device 1100 shown in each of FIGS. 5 and 6 will be described with reference to FIG. 4. Referring to FIGS. 5 and 6, the first, third, fifth, and seventh bump arrays 1111, 1113, 1115, and 1117 may be spaced apart from the center of the lower surface of the memory device 1100 in a first direction (e.g., the forward X-axis direction) toward the first processor 1610 in the lower surface (e.g., the lower surface of the buffer die) of the memory device 1100. The second, fourth, sixth, and eighth bump arrays 1112, 1114, 1116, and 1118 may be spaced apart from the center of the lower surface of the memory device 1100 in a second direction (e.g., the opposite X-axis direction) toward the second processor 1620 in the lower surface of the memory device 1100.

For example, the first bump array 1111 may include an area in which bumps for signals including an address word AWORD are disposed and areas in which bumps for signals including first to fourth data words DWORD1 to DWORD4 are disposed. The signals including the address word AWORD may include the command and address signals CA. The signals including the first to fourth data words DWORD1 to DWORD4 may include the data input/output signals DQ.

In the exemplary embodiment, the first channel may have 128-bits bus. The first channel may include 128 data input/output signals DQ[127:0]. A size of one data word may be 4 bytes. Therefore, the first data word DWORD1 may include 32 data input/output signals DQ[31:0], the second data word DWORD2 may include 32 data input/output signals DQ[63:32], the third data word DWORD3 may include 32 data input/output signals DQ[95:64], and the fourth data word DWORD4 may include 32 data input/output signals DQ[127:96]. However, the number of the data input/output signals per the channel and the number of the data input/output signals per one data word are not limited thereto.

In the exemplary embodiment, referring to FIG. 5, areas of the first to eighth bump arrays 1111 to 1118 may be separated from each other. In the first bump array 1111, an area of the address word AWORD and areas of the first to fourth data words DWORD1 to DWORD4 may be separated from each other. The disposed order of the areas is not limited to that shown in FIG. 5. Although not shown in FIG. 5, power supply bumps may be additionally disposed between the areas. Areas of words of the second to eighth bump arrays 1112 to 1118 may be disposed similarly to the areas of the words of the first bump array 1111. For example, the power supply bumps may be bumps connected to supply power to certain circuitry used for memory access operations in the memory device, such as terminals of one or more transistors that uses a power (e.g., voltage) for operation of the memory device 1100.

In another exemplary embodiment, referring to FIG. 6, to reduce a coupling between the data input/output signals DQ or between the command and address signals CA, the first and third bump arrays 1111 and 1113 may be disposed in the same area. As the above described, since the first channel CH1 and the third channel CH3 are independent of each other, the signals included in the third channel CH3 may not be switched while the signals included in the first channel CH1 are switched. For example, the area of the address word AWORD and the areas of the first to fourth data words DWORD1 to DWORD4 of the first bump array 1111 and an area of an address word AWORD and areas of first to fourth data words DWORD1 to DWORD4 of the third bump array 1113 may be disposed alternately with each other.

In detail, the areas of the address words AWORD of the first and third bump arrays 1111 and 1113 may be disposed adjacent to each other in the Y-axis direction. The areas of the first data words DWORD1 of the first and third bump arrays 1111 and 1113 may be disposed adjacent to each other in the Y-axis direction. The areas of the second to fourth data words DWORD2 to DWORD4 of the first and third bump arrays 1111 and 1113 may also be disposed similarly to the areas of the first data words DWORD1. The second and fourth bump arrays 1112 and 1114, the fifth and seventh bump arrays 1115 and 1117, and the sixth and eighth bump arrays 1116 and 1118 may also be disposed similarly to the first and third bump arrays 1111 and 1113.

Figure 7:
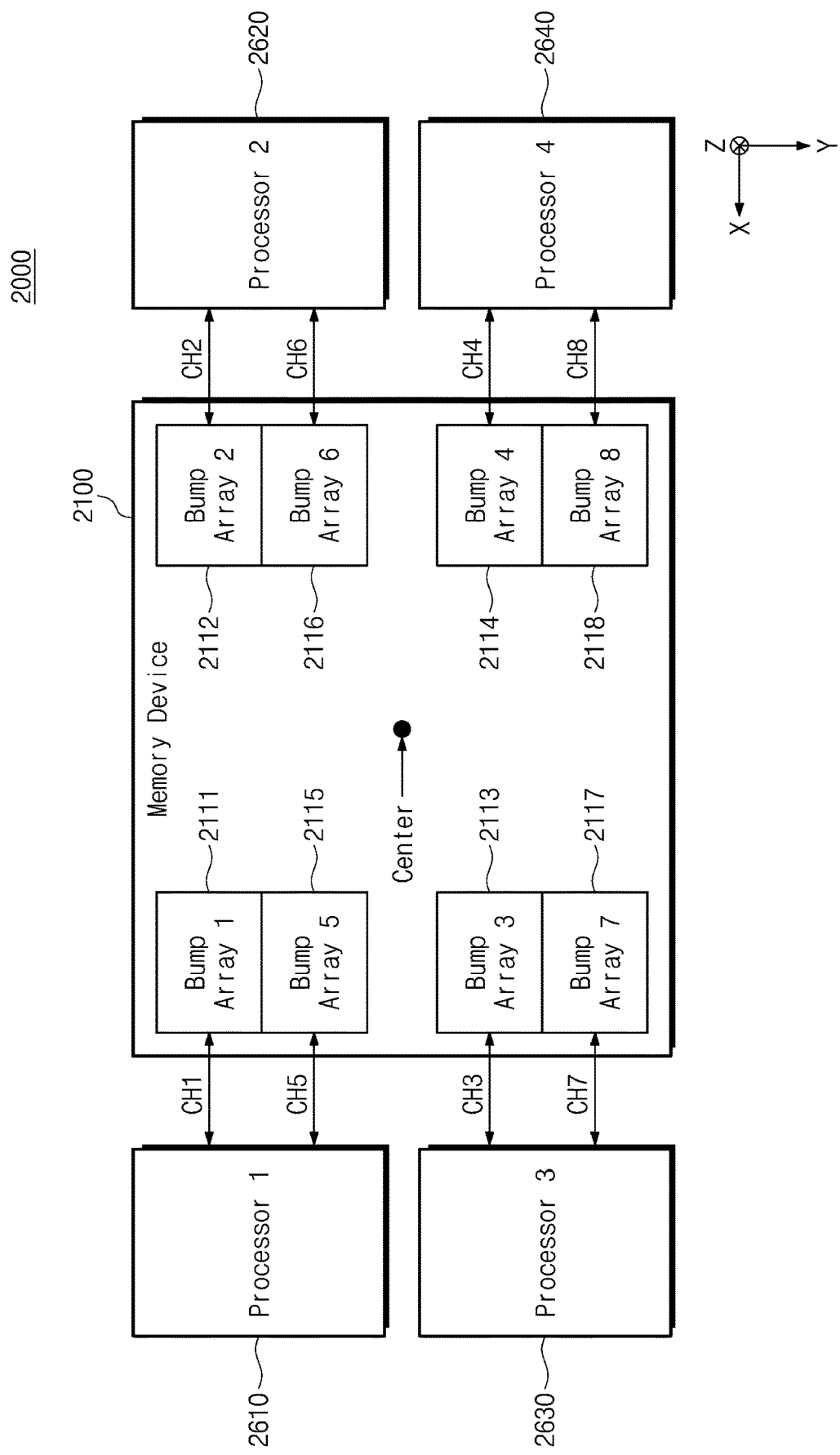
FIG. 7 is a block diagram illustrating a configuration of an electronic system including the electronic device according to an exemplary embodiment of the inventive concept.

FIG. 7 is a block diagram illustrating an electronic device according to another exemplary embodiment of the inventive concept. The electronic device 2000 shown in FIG. 7 will be described with reference to FIGS. 1, 2, and 4. The electronic device 2000 may include a memory device 2100, a first processor 2610, a second processor 2620, a third processor 2630, and a fourth processor 2640. For example, the memory device 2100 may be implemented and operated similarly to the memory device 100 shown in each of FIGS. 1 and 2 or the memory device 1100 shown in FIG. 4. Hereinafter, differences between the electronic device 1000 shown in FIG. 4 and the electronic device 2000 shown in FIG. 7 will be described.

First to eighth bump arrays 2111 to 2118 may be disposed on a lower surface of the memory device 2100. Unlike the memory device 1100 shown in FIG. 4, the first and fifth bump arrays 2111 and 2115 may be disposed adjacent to each other in a direction toward the first processor 2610. The second and sixth bump arrays 2112 and 2116 may be disposed adjacent to each other in a direction toward the second processor 2620. The third and seventh bump arrays 2113 and 2117 may be disposed adjacent to each other in a direction toward the third processor 2630. The fourth and eighth bump arrays 2114 and 2118 may be disposed adjacent to each other in a direction toward the fourth processor 2640. The memory device 2100 may have the same configuration as that the memory device 1100 except for positions of the first to eighth bump arrays 2111 to 2118.

The electronic device 2000 may further include the third and fourth processors 2630 and 2640 as well as the first and second processors 2610 and 2620. Referring to FIG. 7, the first processor 2610 may access internal banks of the memory device 2100 through the first and fifth channels CH1 and CH5 that are independent of each other. For example, the first processor 2610 may be operated similarly to the first processor 1610 shown in FIG. 4. The second to fourth processors 2620 to 2640 may be implemented and operated similarly to the first processor 2610.

The second processor 2620 may access the internal banks of the memory device 2100 through the second and sixth channels CH2 and CH6 that are independent of each other. The third processor 2630 may access the internal banks of the memory device 2100 through the third and seventh channels CH3 and CH7 that are independent of each other.

The fourth processor 2640 may access the internal banks of the memory device 2100 through the fourth and eighth channels CH4 and CH8 that are independent of each other. The memory device 2100 may provide channels to each of at least four homogeneous processors or to each of at least four heterogeneous processors.

In the exemplary embodiment, a bandwidth and the number of the channels to be provided to each of processors may be determined by the number of processors that access the memory device 2100. For example, the memory device 2100 may support eight channels, and each of the channels may include 128-bits data bus. Referring to FIG. 7, the first to fourth processors 2610 to 2640 may access the memory device 2100, independently. In this exemplary embodiment, each of the first to fourth processors 2610 to 2640 may access the banks of the memory device 2100 through two channels. Each of the first to fourth processors 2610 to 2640 may access the banks of the memory device 2100 through the 256-bits data bus. As the number of processors increases, the number of channels to be provided to each of the processors may be decreased.

Referring to FIG. 7, the channels supported by the memory device 2100 may be uniformly distributed to the first to fourth processors 2610 to 2640. According to an alternative embodiment, the number of channels which is provided to each of the processors may not be uniform. For example, the first processor 2610 may access the memory device 2100 through the first, fifth, and third channels, CH1, CH5, and CH3, and the third processor 2630 may access the memory device 2100 through the seventh channel CH7. For example, the number of channels, which is provided to each of the processors, may be determined according to a size of a data bus required by each of the processors.

In the exemplary embodiment, the first processor 2610, one of the first and fifth bump arrays 2111 and 2115, one of the second and sixth bump arrays 2112 and 2116, and the second processor 2620 may be disposed sequentially along a first axis that passes a center of the lower surface of the memory device 2100 and is parallel to the X-axis. Similarly, the third processor 2630, one of the third and seventh bump arrays 2113 and 2117, one of the fourth and eighth bump arrays 2114 and 2118, and the fourth processor 2640 may be disposed sequentially along the first axis.

The first and fifth bump arrays 2111 and 2115 and the second and sixth bump arrays 2112 and 2116 may be symmetrical with respect to a second axis, respectively. Similarly, the third and seventh bump arrays 2113 and 2117 and the fourth and eighth bump arrays 2114 and 2118 may be symmetrical with respect to the second axis, respectively. The second axis may be perpendicular to the first axis, be parallel to the Y-axis, and pass the center of the lower surface of the memory device 2100.

Figure 8:
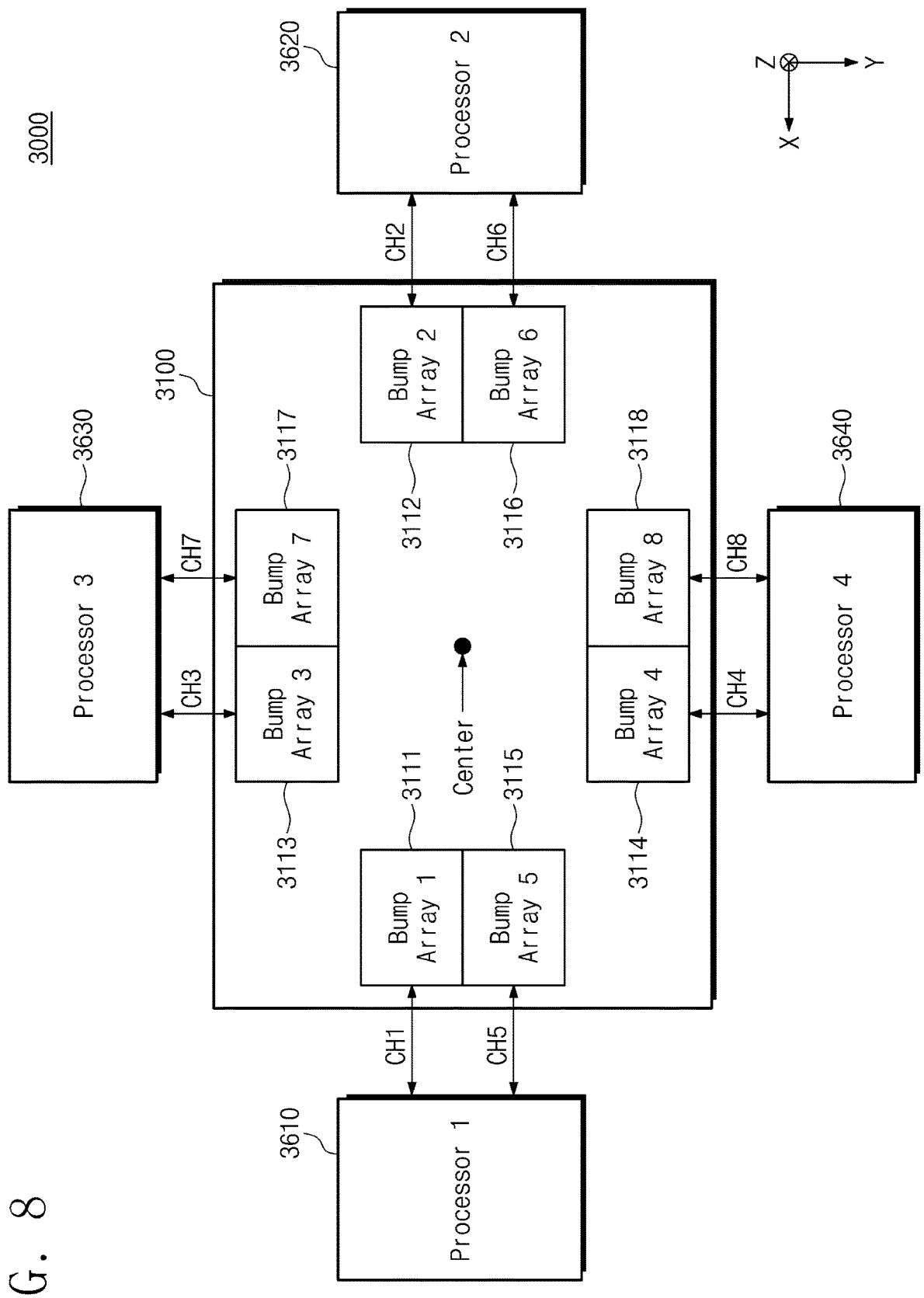
FIG. 8 is a block diagram illustrating an electronic device according to an exemplary embodiment of the inventive concept.

FIG. 8 is a block diagram illustrating an electronic device according to another exemplary embodiment of the inventive concept. The electronic device 3000 shown in FIG. 8 will be described with reference to FIG. 7. The electronic device 3000 may include a memory device 3100, a first processor 3610, a second processor 3620, a third processor 3630, and a fourth processor 3640. The memory device 3100, the first processor 3610, the second processor 3620, the third processor 3630, and the fourth processor 3640 may have the same structure and function as those shown in FIG. 7. Hereinafter, differences between the electronic device 2000 shown in FIG. 7 and the electronic device 3000 shown in FIG. 8 will be described.

Referring to FIG. 8, the first processor 3610 may be adjacent to a first side of the buffer die of the memory device 3100. The second processor 3620 may be adjacent to a second side of the buffer die. The third processor 3630 may be adjacent to a third side of the buffer die. The fourth processor 3640 may be adjacent to a fourth side of the buffer die. The first side and the second side may oppose each other. The third side and the fourth side may oppose each other. The first and fifth bump arrays 3111 and 3115, the second and sixth bump arrays 3112 and 3116, the third and seventh bump arrays 3113 and 3117, and the fourth and eighth bump arrays 3114 and 3118 may be disposed adjacent to the first to fourth sides, respectively.

The first processor 3610, one of the first and fifth bump arrays 3111 and 3115, one of the second and sixth bump arrays 3112 and 3116, and the second processor 3620 may be disposed sequentially along a first axis that passes a center of the lower surface of the memory device 3100 and is parallel to the X-axis. On the other hand, the third processor 3630, one of the third and seventh bump arrays 3113 and 3117, one of the fourth and eighth bump arrays 3114 and 3118, and the fourth processor 3640 may be disposed sequentially along a second axis that passes a center of the lower surface of the memory device 3100 and is parallel to the Y-axis. The first axis may be perpendicular to the second axis, but an angle between the first axis and the second axis is not limited thereto.

The disposed positions of the first to eighth bump arrays 3111 to 3118 of the electronic device 3000 may be different from the disposed positions of the first to eighth bump arrays 2111 to 2118 of the electronic device 2000. The disposed positions of the first to eighth bump arrays 3111 to 3118 of the electronic device 3000 are not limited to those shown in FIG. 8. The first and fifth bump arrays 3111 and 3115 may be disposed on the lower surface of the electronic device 3000 and may be adjacent to the first processor 3610. Other bump arrays 3112 to 3114 and 3116 to 3118 may be disposed similarly to the first and fifth bump arrays 3111 and 3115

Figure 9:
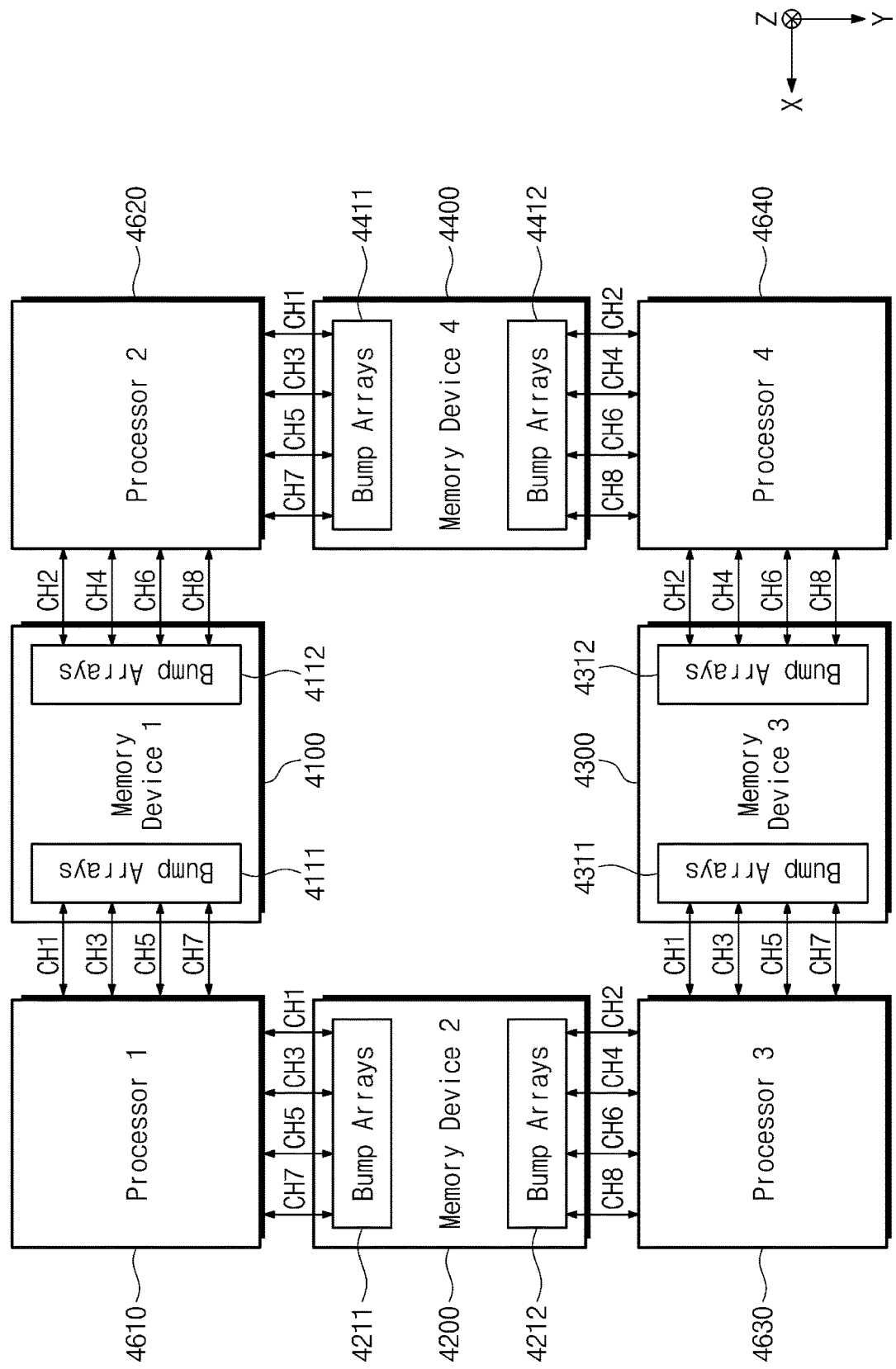
FIG. 9 is a block diagram illustrating an electronic device according to an exemplary embodiment of the inventive concept.

FIG. 9 is a block diagram illustrating an electronic device according to another exemplary embodiment of the inventive concept. The electronic device 4000 shown in FIG. 9 will be described with reference to FIGS. 1, 2, and 4. The electronic device 4000 may include first to fourth memory devices 4100 to 4400 and first to fourth processors 4610 to 4640. For example, the first to fourth memory devices 4100 to 4400 may each be the memory device 1100 shown in FIG. 4.

Similar to the memory device 1100 shown in FIG. 4, the first memory device 4100 may provide first, third, fifth, and seventh channels CH1, CH3, CH5, and CH7 to the first processor 4610, and may provide second, fourth, sixth, and eighth channels CH2, CH4, CH6, and CH8 to the second processor 4620. Bump arrays 4111 may be disposed on a lower surface of the first memory device 4100 toward the first processor 4610, and bump arrays 4112 may be disposed on the lower surface of the first memory device 4100 toward the second processor 4620.

Similar to the first memory device 4100, the second to fourth memory devices 4200 to 4400 may provide channels to the first to fourth processors 4610 to 4640. In detail, the second memory device 4200 may provide first, third, fifth, and seventh channels CH1, CH3, CH5, and CH7 to the first processor 4610, and may provide second, fourth, sixth, and eighth channels CH2, CH4, CH6, and CH8 to the third processor 4630. The third memory device 4300 may provide first, third, fifth, and seventh channels CH1, CH3, CH5, and CH7 to the third processor 4630, and may provide second, fourth, sixth, and eighth channels CH2, CH4, CH6, CH8 to the fourth processor 4640. The fourth memory device 4400 may provide first, third, fifth, and seventh channels CH1, CH3, CH5, and CH7 to the second processor 4620, and may provide second, fourth, sixth, and eighth channels CH2, CH4, CH6, and CH8 to the fourth processor 4640.

In the exemplary embodiment, the first processor 4610, the bump arrays 4111 and 4112, and the second processor 4620 may be disposed along the X-axis. The third processor 4630, bump arrays 4311 and 4312, and the fourth processor 4640 may be disposed along the X-axis. The first processor 4610, bump arrays 4211 and 4212, and the third processor 4630 may be disposed along the Y-axis. The second processor 4620, bump arrays 4411 and 4412, and the fourth processor 4640 may be disposed along the Y-axis.

Figure 10:
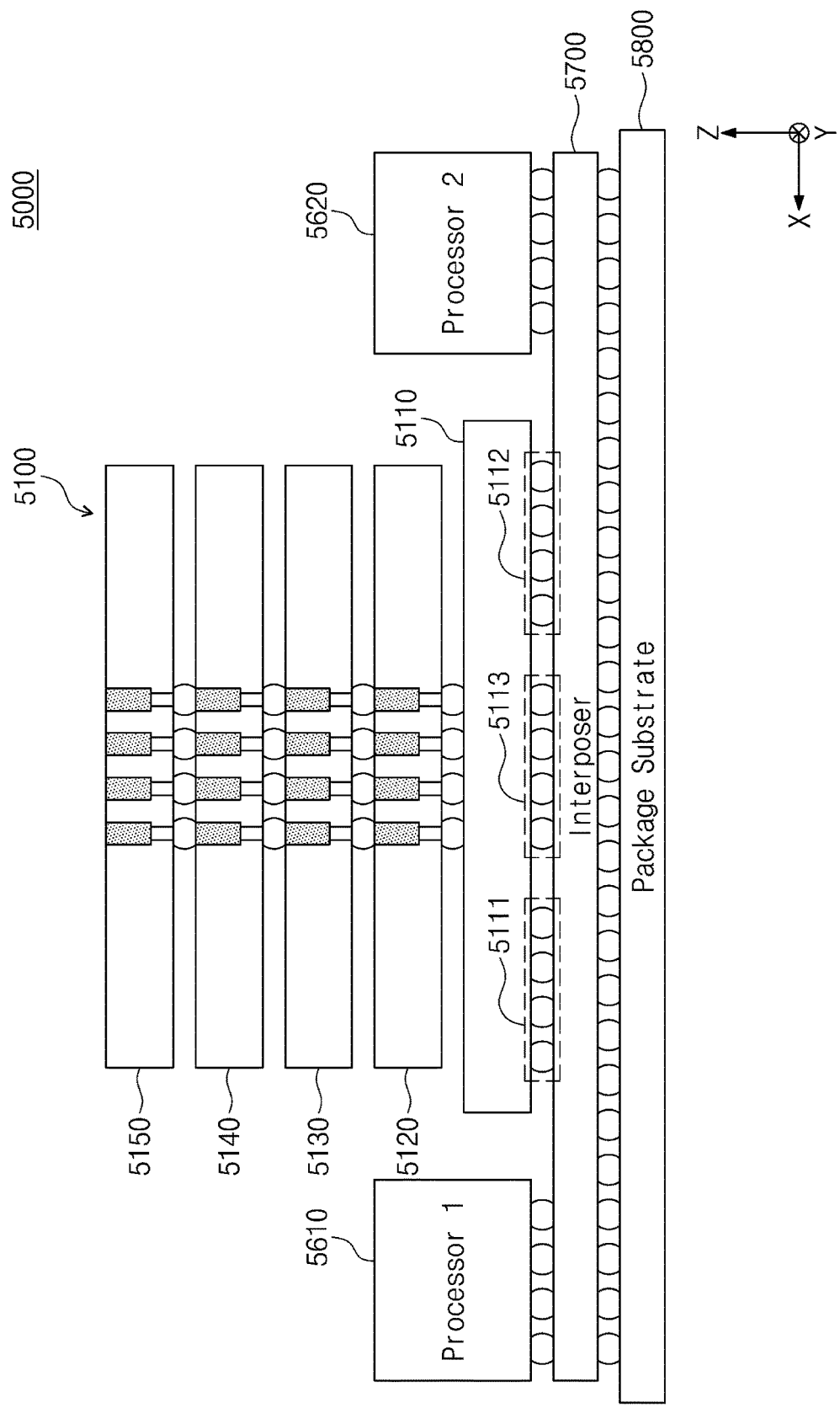
FIG. 10 is a cross-sectional view of an electronic device according to an exemplary embodiment of the inventive concept.

FIG. 10 is a cross-sectional view of an electronic device according to another exemplary embodiment of the inventive concept. The electronic device 5000 shown in FIG. 10 will be described with reference to FIG. 4. The electronic device 5000 may include a memory device 5100, a first processor 5610, a second processor 5620, an interposer 5700, and a package substrate 5800. The memory device 5100, the first processor 5610, and the second processor 5620 may have the same structure and function as those shown in FIG. 4.

The memory device 5100 may include a buffer die 5110 and first to fourth memory dies 5120 to 5150. The buffer die 5110 may include first to third bump arrays 5111 to 5113. Signals included in one channel may be transmitted through the first bump array 5111. Signals included in one channel may be transmitted through the second bump array 5112. Global signals common to all channels may be transmitted through the third bump array 5113 between the first bump array 5111 and the second bump array 5112. The first to fourth memory dies 5120 to 5150 may be sequentially stacked on the buffer die 5110 in the Z-axis direction.

Paths between the memory device 5100 and the first processor 5610 and paths between the memory device 5100 and the second processor 5620 may be implemented in the interposer 5700. According to exemplary embodiments, the interposer 5700 may include paths of a channel between the first bump array 5111 and the first processor 5610 and paths of a channel between the second bump array 5112 and the second processor 5620. Also, the interposer 5700 may further include paths of other channels. The paths may be formed in the interposer 5700 using a conductive material (e.g., metal). The interposer 5700 may include an insulating material surrounding the paths. The insulating material may include germanium, silicon-germanium, gallium-arsenic (GaAs), glass, ceramic, and the like.

The memory device 5100, the first processor 5610, and the second processor 5620 may be respectively stacked on the interposer 5700. The first to third bump arrays 5111 to 5113 may be disposed between the interposer 5700 and the memory device 5100. At least one bump may be disposed between the interposer 5700 and the first processor 5610. At least one bump may be disposed between the interposer 5700 and the second processor 5610. Although not shown in FIG. 10, the interposer 5700 may further include at least one through silicon via formed in the Z-axis direction to electrically connect between the package substrate 5800 and the memory device 5100 and between the package substrate 5800 and the first and second processors 5610 and 5620.

The interposer 5700 may be stacked on the package substrate 5800. The package substrate 5800 may be electrically connected to the interposer 5700 through at least one bump. For example, other components not shown in FIG. 10 may be further stacked on the package substrate 5800. The package substrate 5800 may electrically connect between the memory device 5100 and the other components. For example, the other components may include a display, a driving circuit to drive the display, a sensor, a RF chip, an embedded/card storage, a speaker, a microphone, GPS, and the like. Although a package substrate 5800 is described, a substrate on which the interposer 5700, memory device 5100, and first and second processors 5610 and 5620 may be generally described as a printed circuit board, and may be, for example, a module board.

In the exemplary embodiment, the electronic device 5000 may be a server, a computer, a smart phone, a tablet, a personal digital assistant (PDA), a digital camera, a portable multimedia player (PMP), a wearable device, an internet of things (IoT), and the like, but it is not limited thereto.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention.

Figure 11:
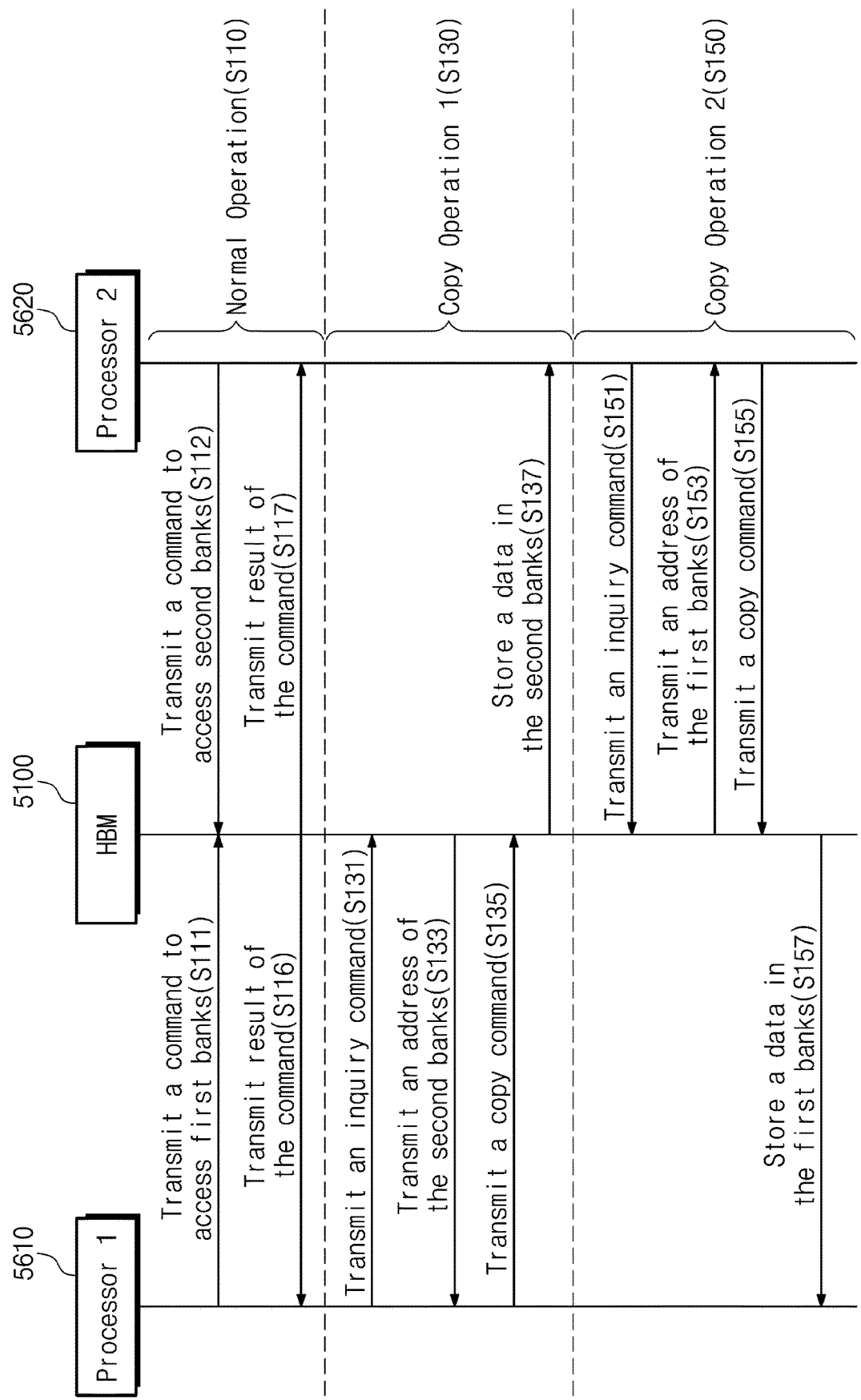
FIG. 11 is a flowchart for describing exemplary operations of a memory device, a first processor, and a second processor shown in FIG. 10.

FIG. 11 is a flowchart for describing operations of the memory device, the first processor, and the second processor shown in FIG. 10. The flowchart shown in FIG. 11 will be described with reference to FIGS. 4 and 10. For example, the memory device 5100 may be an HBM device. The operations of the memory device 5100, the first processor 5610, and the second processor 5620 may include a normal operation S110, a first copy operation S130, and a second copy operation S150. The order of the normal operation S110, the first copy operation S130, and the second copy operation S150 is not limited to that shown in FIG. 11.

In operation S111, the first processor 5610 may access first banks by transmitting at least one command through at least one channel. The at least one channel may be at least one of the first, third, fifth, and seventh channels CH1, CH3, CH5, and CH7 described in FIG. 4. The first banks may be allocated to channels which are provided to the first processor 5610 by the memory device 5100. The first processor 5610 may transmit commands to the first memory device 5100 through at least two channels at the same time (e.g., simultaneously) or at different times.

Similarly, in operation S112, the second processor 5620 may access second banks by transmitting at least one command through at least one channel. The at least one channel may be at least one of the second, fourth, sixth, and eighth channels CH2, CH4, CH6, and CH8 described in FIG. 4. The second banks may be allocated to channels which are provided to the second processor 5620 by the memory device 5100. As described above, the channels provided to the first processor 5610 are different from the channels provided to the second processor 5620. Operation S111 and operation S112 may be independent of each other, and the order of operation S111 and operation S112 is not limited to that shown in FIG. 11.

In operation S116, the memory device 5100 may transmit results of processing the command received from the first processor 5610 to the first processor 5610 through at least one channel (e.g., through one of the first, third, fifth, and seventh channels CH1, CH3, CH6, and CH7 described in FIG. 4). Similarly, in operation S117, the memory device 5100 may transmit results of processing the command received from the second processor 5620 to the second processor 5620 through at least one channel (e.g., through one of the second, fourth, sixth, and eighth channels CH2, CH4, CH6, and CH8 described in FIG. 4). Similarly, operation S116 and operation S117 may be independent of each other, and the order of operation S116 and operation S117 is not limited to that shown in FIG. 11. For example, operation S116 may be performed after a time required for the memory device 5100 to process the command of operation S111. Similarly, in operation S117 may be performed after a time required for the memory device 5100 to process the command of operation S112.

In the exemplary embodiment, in the normal operation S110, the first processor 5610 and the second processor 5620 may access the memory device 5100 independently of each other. The first processor 5610 may exchange data with the first banks, and the second processor 5620 may refresh or not access the second banks. The second processor 5620 may transmit a precharge power-down command, an active power-down command, or a self-refresh command to the memory device 5100. Alternatively, the second processor 5620 may exchange data with the second banks, and the first processor 5610 may refresh or not access the first banks.

In the exemplary embodiment, the first processor 5610 may copy data stored in the first banks to the second banks for the second processor 5620. In operation S131, the first processor 5610 may transmit an inquiry command to the memory device 5100. The inquiry command may be transmitted through at least one of channels provided to the first processor 5610. In operation S133, the buffer die of the memory device 5100 may transmit an address, which indicates an area of the second banks where data is not stored, to the first processor 5610 in response to the inquiry command. In operation S135, the first processor 5610 may transmit a copy command to the memory device 5100. In operation S137, the buffer die of the memory device 5100 may store data stored in the first banks in the area of the second banks, where data are not stored, in response to the copy command.

The second copy operation S150 may be performed similarly to the first copy operation S130. In operation S151, the second processor 5620 may transmit an inquiry command to the memory device 5100. In operation S153, the buffer die of the memory device 5100 may transmit an address, which indicates an area of the first banks where data is not stored, to the second processor 5620 in response to the inquiry command. In operation 155, the second processor 5620 may transmit the copy command to the memory device 5100. In operation S157, the buffer die of the memory device 5100 may store data stored in the second banks in the area of the first banks, where data are not stored, in response to the copy command.

For the first and second copy operations S130 and S150, the buffer die may include at least one register to store addresses, which indicate areas of the first and second banks where data is stored. The buffer die may include at least one register to temporarily store data to copy.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
a buffer die configured to communicate with a first processor through a first channel and configured to communicate with a second processor through a second channel, the buffer die including a first bump array configured to electrically connect the first channel to the first processor and a second bump array configured to electrically connect the second channel to the second processor; and
a plurality of memory dies each sequentially stacked on the buffer die through a plurality of through silicon vias, the memory dies including first banks allocated to the first channel and second banks allocated to the second channel,
wherein the first bump array is disposed adjacent to a first side of the buffer die adjacent to the first processor,
wherein the second bump array is disposed adjacent to a second side of the buffer die adjacent to the second processor and opposite to the first side in a first direction parallel to a lower surface of the buffer die, and
wherein the first channel and the second channel are independent of each other such that the first banks allocated to the first channel are accessed only by the first processor not the second processor through the first channel and the second banks allocated to the second channel are accessed only by the second processor not the first processor through the second channel,
wherein the buffer die further includes a third bump array allocated to a third channel and a fourth bump array allocated to a fourth channel,
wherein a first memory die of the plurality of memory dies includes the first banks and the second banks, and
wherein a second memory die of the plurality of memory dies includes third banks allocated to the third channel and fourth banks allocated to the fourth channel.

2. The memory device of claim 1,
wherein the first bump array and the second bump array are spaced apart from each other in the first direction.

3. The memory device of claim 2,
wherein the first side and the second side are opposing edges of the lower surface of the buffer die.

4. The memory device of claim 1, wherein the buffer die is further configured to communicate with the first processor through the third channel and further configured to communicate with the second processor through the fourth channel,
wherein the third bump array is disposed adjacent to the first side of the buffer die, and
wherein the fourth bump array is disposed adjacent to the second side of the buffer die.

5. The memory device of claim 1, wherein the buffer die is further configured to communicate with a third processor adjacent to the first side through the third channel and further configured to communicate with a fourth processor adjacent to the second side through the fourth channel,
wherein the third bump array is disposed adjacent to the first side of the buffer die, and
wherein the fourth bump array is disposed adjacent to the second side of the buffer die.

6. The memory device of claim 1, wherein the buffer die is further configured to communicate with a third processor adjacent to a third side of the buffer die through the third channel and further configured to communicate with a fourth processor adjacent to a fourth side of the buffer die through the fourth channel,
wherein the third bump array is disposed adjacent to the third side of the buffer die,
wherein the fourth bump array is disposed adjacent to the fourth side of the buffer die, and
wherein the third side and the fourth side are opposite each other in the first direction.

7. The memory device of claim 3, wherein a first memory die of the plurality of memory dies comprises all of the first banks, and wherein a second memory die of the plurality of memory dies comprises all of the second banks.

8. A memory device comprising:
a buffer die including a first bump array and a second bump array spaced apart from each other in a first direction parallel to a lower surface of the buffer die;
a first memory die stacked on the buffer die through a plurality of first through silicon vias and including banks; and
a second memory die stacked on the first memory die by a plurality of second through silicon vias and including banks,
wherein the first bump array is provided for a first channel to communicate between the first and second memory dies and a first processor,
wherein the second bump array is provided for a second channel to communicate between the first and second memory dies and a second processor, and
wherein the first channel and the second channel are independent of each other such that banks allocated to the first channel are accessed only by the first processor not the second processor through the first channel and banks allocated to the second channel are accessed only by the second processor not the first processor through the second channel,
wherein first banks of the first channel are accessed through the first bump array,
wherein second banks of the second channel are accessed through the second bump array and are different from the first banks,
wherein the banks of the first memory die include all of the first banks, and
wherein the banks of the second memory die include all of the second banks.

9. The memory device of claim 8, wherein the first banks comprise a portion of banks from the banks of both the first and second memory dies, and
wherein the second banks comprise the remaining portion of banks from the banks of both the first and second memory dies.

10. The memory device of claim 8, wherein the first bump array comprises bumps configured to transmit or receive signals of the first channel, and
wherein the second bump array comprises bumps configured to transmit or receive signals of the second channel.

11. The memory device of claim 10, wherein signals transmitted or received through the first channel only control operations between the first and second memory dies and the first processor and signals transmitted or received through the second channel only control operations between the first and second memory dies and the second processor.

12. An electronic device comprising:
a memory device including a buffer die and a plurality of memory dies each sequentially stacked on the buffer die through a plurality of through silicon vias, the plurality of memory dies including first banks allocated to a first channel and second banks allocated to a second channel;
a first processor configured to access the first banks through the first channel; and
a second processor configured to access the second banks through the second channel,
wherein the buffer die includes:
a first bump array disposed on a first side of the buffer die adjacent to the first processor and including bumps configured to transmit and receive signals of the first channel; and
a second bump array disposed on a second side of the buffer die opposite to the first side in a first direction parallel to a lower surface of buffer die adjacent to the second processor and including bumps configured to transmit and receive signals of the second channel,
wherein the first channel and the second channel are independent of each other,
wherein the buffer die further includes a third bump array allocated to a third channel and a fourth bump array allocated to a fourth channel,
wherein a first memory die of the plurality of memory dies includes the first banks and the second banks, and
wherein a second memory die of the plurality of memory dies includes third banks allocated to the third channel and fourth banks allocated to the fourth channel.

13. The electronic device of claim 12, wherein the signals of the first channel comprise;
clock signals transmitted from the first processor;
row command and address signals synchronized to the clock signals and used to select at least one word line of the first banks;
column command and address signals synchronized to the clock signals and used to select bit lines crossing the at least one word line; and
data input/output signals including a write data stored to memory cells selected depending on the row command and address signals and the column command and address signals or a read data output from the memory cells.

14. The electronic device of claim 13, wherein a number of the memory cells is determined based on 2n prefetch that is supported by the memory device, where "n" is natural number.

15. The electronic device of claim 13, further comprising an interposer including first paths for the first channel between the first bump array and the first processor and second paths for the second channel between the second bump array and the second processor.

16. The electronic device of claim 12,
wherein the buffer die is configured to transmit an address, which indicates an area of the second banks where data is not stored, to the first processor in response to a first inquiry command of the first processor or configured to transmit an address, which indicates an area of the first banks where data is not stored, to the second processor in response to a second inquiry command of the second processor.

17. The electronic device of claim 16,
wherein the buffer die is configured to store data stored in the first banks in the area of the second banks in response to a first copy command of the first processor or configured to store data stored in the second banks in the area of the first banks in response to a second copy command of the second processor.

* * * * *